United States Patent
Frickey et al.

(10) Patent No.: US 9,524,774 B2
(45) Date of Patent: *Dec. 20, 2016

(54) LOWER PAGE READ FOR MULTI-LEVEL CELL MEMORY

(71) Applicant: Intel Corporation, Santa Clara, CA (US)

(72) Inventors: Robert E. Frickey, Sacramento, CA (US); Yogesh B. Wakchaure, Folsom, CA (US); Iwen Chao, Sacramento, CA (US); Xin Guo, San Jose, CA (US); Kristopher H. Gaewsky, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/954,002

(22) Filed: Nov. 30, 2015

(65) Prior Publication Data

US 2016/0155497 A1 Jun. 2, 2016

Related U.S. Application Data

(63) Continuation of application No. 13/714,763, filed on Dec. 14, 2012, now Pat. No. 9,236,136.

(51) Int. Cl.
*G11C 11/56* (2006.01)
*G11C 16/34* (2006.01)
*G06F 12/02* (2006.01)

(52) U.S. Cl.
CPC ........ *G11C 11/5642* (2013.01); *G11C 11/5628* (2013.01); *G11C 16/3404* (2013.01); *G11C 16/3418* (2013.01); *G06F 12/0246* (2013.01); *G06F 2212/1032* (2013.01); *G11C 2211/5641* (2013.01); *G11C 2211/5646* (2013.01)

(58) Field of Classification Search
CPC ............. G11C 11/5621; G11C 11/5628; G11C 16/0483; G11C 2211/5646; G11C 2211/5641; G11C 11/5642; G11C 16/3404; G11C 16/3418; G06F 12/0246; G06F 2212/1032

See application file for complete search history.

(56) References Cited

U.S. PATENT DOCUMENTS 8,886,877 B1    11/2014 Avila et al.
2006/0126393 A1  6/2006 Li
(Continued)

OTHER PUBLICATIONS

ONFI, "Open Nand Flash Interface Specification", Revision 3.0, Mar. 9, 2011, 288 Pages.

*Primary Examiner* — David X Yi
*Assistant Examiner* — Rocio Del Mar Perez-Velez
(74) *Attorney, Agent, or Firm* — Alpine Technology Law Group LLC

(57) ABSTRACT

An electronic memory or controller may use a first type of read command, addressed to a first page of memory of an electronic memory that includes information to indicate that a second page of memory of the electronic memory has not been programmed and a second type of read command, addressed to the first page of memory, that includes information to indicate that the second page of memory has been programmed. The first page of memory may include a lower page of a multi-level cell (MLC), and the second page of memory may include an upper page of the same MLC. The second page of memory is enabled during a period of time that the first type of read command is used.

18 Claims, 8 Drawing Sheets

(56) References Cited

U.S. PATENT DOCUMENTS

| | | |
|---|---|---|
| 2007/0271494 A1 | 11/2007 | Gorobets |
| 2008/0013382 A1 | 1/2008 | Tang |
| 2008/0123412 A1 | 5/2008 | Lasser |
| 2009/0138652 A1 | 5/2009 | Kim et al. |
| 2009/0300237 A1 | 12/2009 | Nobunaga et al. |
| 2009/0300311 A1 | 12/2009 | Lee |
| 2009/0302815 A1 | 12/2009 | Tanzawa |
| 2009/0316489 A1 | 12/2009 | Han |
| 2010/0008136 A1 | 1/2010 | Seol et al. |
| 2010/0082884 A1 | 4/2010 | Chen et al. |
| 2010/0262738 A1 | 10/2010 | Swing et al. |
| 2010/0290294 A1 | 11/2010 | Siau |
| 2010/0318724 A1 | 12/2010 | Yeh |
| 2011/0029718 A1 | 2/2011 | Frickey et al. |
| 2011/0280083 A1 | 11/2011 | Choi et al. |
| 2012/0012897 A1 | 1/2012 | Besser et al. |
| 2012/0211716 A1 | 8/2012 | Meyer |
| 2012/0304039 A1 | 11/2012 | Peterson et al. |
| 2012/0314468 A1 | 12/2012 | Siau et al. |
| 2012/0314477 A1 | 12/2012 | Siau |
| 2013/0031443 A1 | 1/2013 | Oh et al. |
| 2013/0227200 A1 | 8/2013 | Cometti et al. |
| 2013/0322169 A1 | 12/2013 | Goss et al. |
| 2014/0164872 A1 | 6/2014 | Frickey et al. |

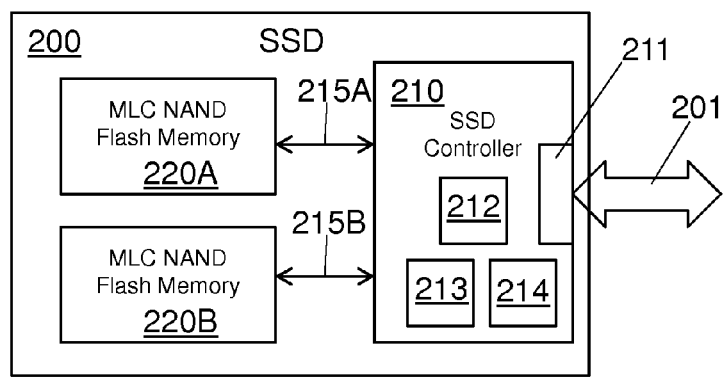
FIG. 2A
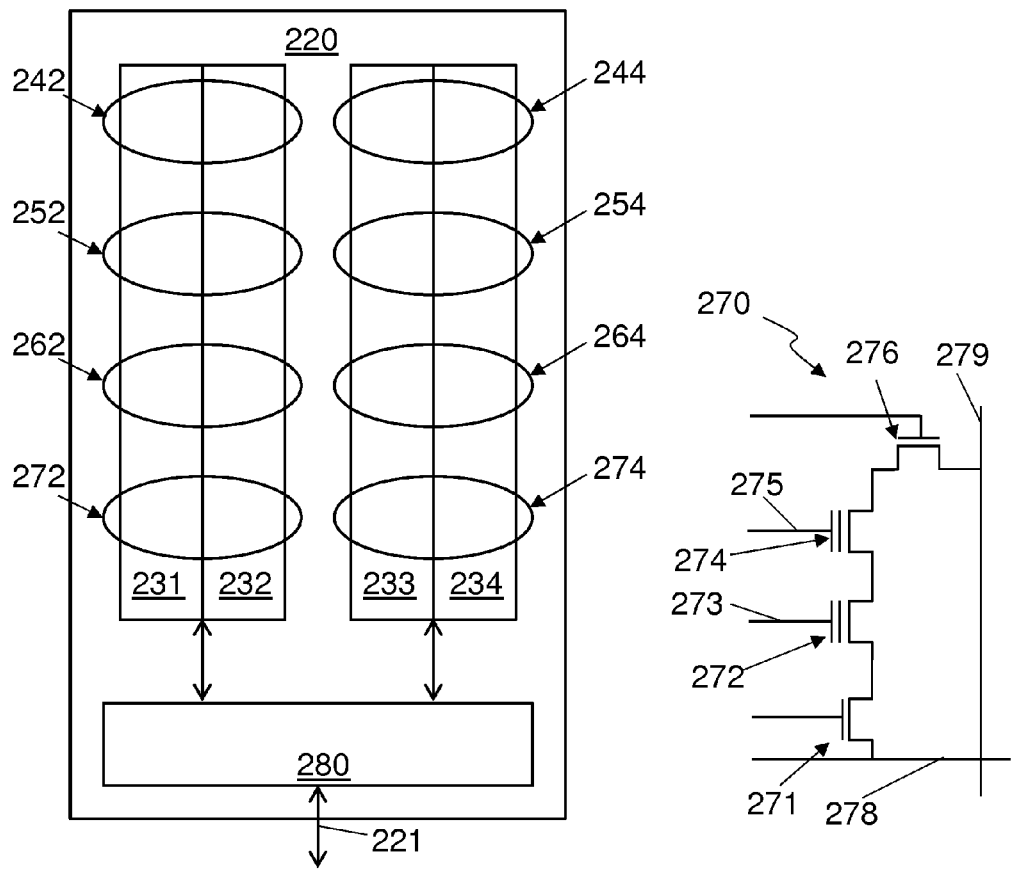
FIG. 2B
FIG. 2C

LOWER PAGE READ FOR MULTI-LEVEL CELL MEMORY

CROSS-REFERENCE TO RELATED APPLICATIONS

The present application is a continuation of U.S. application Ser. No. 13/714,763 filed Dec. 14, 2012. Said application Ser. No. 13/714,763, is hereby incorporated herein in its entirety.

BACKGROUND

The present subject matter relates to semiconductor memories, and more specifically, to multi-level cell (MLC) flash memory.

Many types of semiconductor memory are known in the art. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The threshold voltage of the MOSFET-based flash cell can be changed by changing the amount of charge stored in the charge storage region of the cell, and the threshold voltage can be used to indicate a value that is stored in the flash cell.

Some flash devices may store a single binary bit of data per cell. Such flash cells may be referred to as single-level cells (SLC). Other flash devices may allow for more than one binary bit of data to be stored in a single flash cell by using multi-level cells (MLC). In an MLC, the threshold voltage of the flash cell may be set to one of $2^n$ different target levels to represent 'n' bits of storage. So for example, an MLC capable of storing 3 bits of information may have 8 different targeted voltage levels for its threshold voltage.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string. Some NAND flash memories may use MLCs to increase storage density.

BRIEF DESCRIPTION OF THE DRAWINGS

The accompanying drawings, which are incorporated in and constitute part of the specification, illustrate various embodiments. Together with the general description, the drawings serve to explain various principles. In the drawings:

FIG. 2A is a block diagram of a solid state drive suitable for use in an embodiment;

FIG. 2B is a block diagram of an electronic memory device suitable for use in an embodiment;

FIG. 2C is a schematic of a floating gate NAND flash string suitable for use in an embodiment;

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
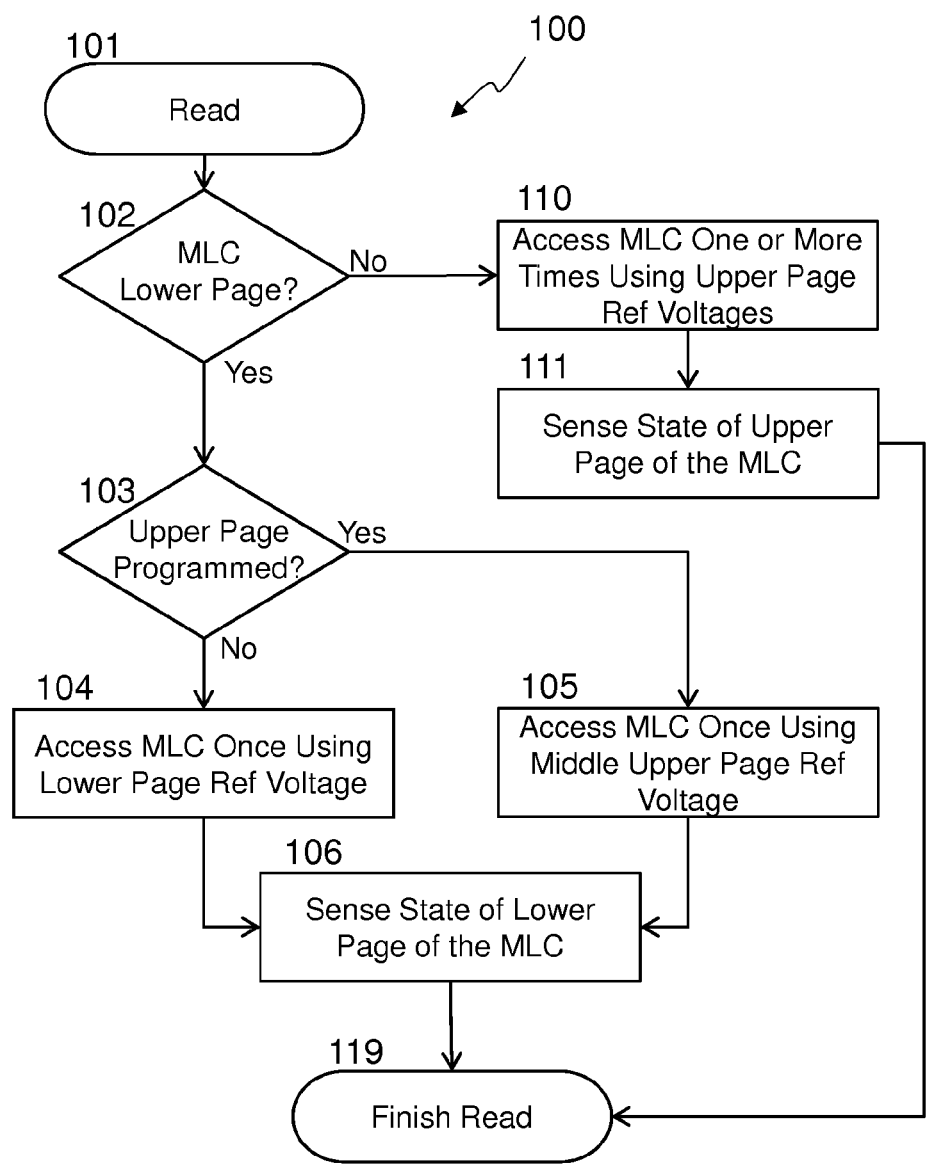
FIG. 1 is a flow chart of an embodiment of a method to read an electronic memory.
Figure 3:
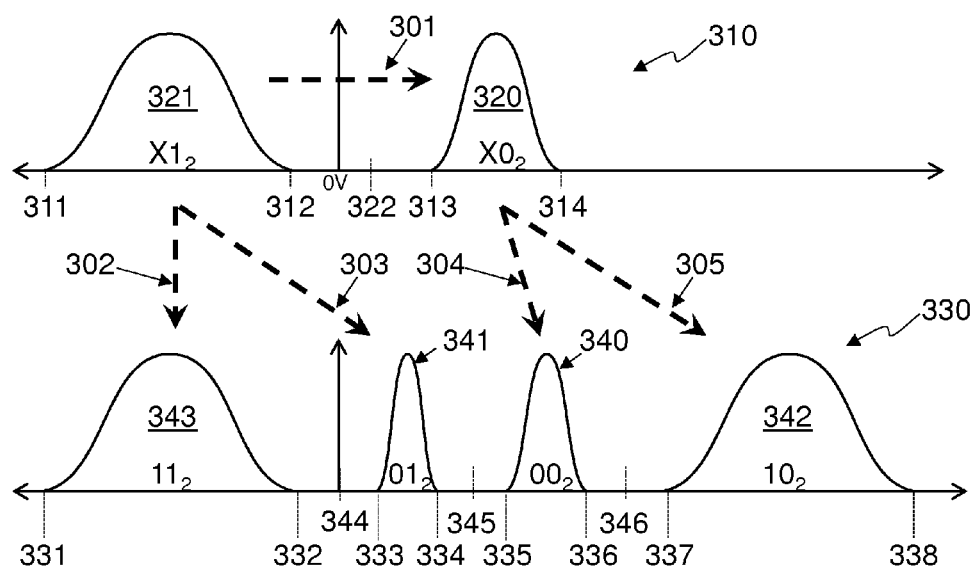
FIG. 3 shows various states of a multi-level cell (MLC) suitable for use in an embodiment.

FIG. 1 is a flow chart 100 of an embodiment of a method to read an electronic memory starting at block 101. The electronic memory may include a multi-level cell (MLC) having a lower page and an upper page to store at least two bits of data. The read may be for a page of memory that includes a bit of storage of the MLC and a read address may be provided. A page of memory can be any amount of storage, depending on the embodiment, but refers to the smallest amount of memory that can be accessed in the electronic memory device. In some memory devices, a page may be as small as one binary bit of information, but other memory devices may use a page much larger, such as four kilobytes (4096×8 or 16,384 bits), or even larger. An MLC can store any number of bits of information, depending on the embodiment, and a current state of the MLC. In some embodiments, the MLC can store up to two bits of information by having its threshold voltage set to a level in one of four different voltage ranges. In other embodiments, the MLC can store any number of bits of information, including 4, 8, 16, or more, and in some embodiments, the number of bits stored in the MLC may not be limited to powers of 2. The different bits of storage within an MLC may be referred to as different pages within the MLC. In embodiments, the different pages within a single MLC may be assigned to different pages of memory, as shown in FIG. 2B. One of the bits stored in the MLC may be assigned to a lower page of the MLC and another one of the bits of the MLC may be assigned to an upper page of the MLC. One mapping of data values stored in the lower page and the upper page to threshold voltage of the MLC is shown in FIG. 3.

Some embodiments may include a mode to disable the use of one or more pages of the MLC, such as to limit the electronic memory to treat the MLC as a single-level cell (SLC) storing only a single bit of information and having only two different states. Changing such a mode may change the behavior of both read operations and program operations. If an embodiment includes such a mode of operation, it should be noted that a mode to treat the MLC as an SLC is disabled for the various methods, apparatuses and articles of manufacture described herein. The electronic memory is in a mode that allows multiple bits of data to be stored in the MLC for the embodiments described, even if the MLC is only storing a single bit of information at a given point in time.

The request to read the page of memory may be initiated by various events, depending on the embodiment. In one embodiment, a controller, such as the solid-state drive controller shown in FIG. 2A, may send a read command to an electronic memory device which may be interpreted as a read request. In another embodiment, an information technology system, such as that shown in FIG. 8, may read a file, which may cause the operating system, which may include a flash file management system, to take various actions, including a read operation of the memory device which may be interpreted as a read request.

At block 102 the read address may be checked to see if the lower or upper page of the MLC is being read. If a lower page is being read, a check may be made at block 103 to determine if the second, or upper, page of memory has been programmed. If the upper page of the MLC has not been programmed, the MLC may be accessed once at block 104, using a lower page reference voltage, in response to the read request addressed to the page of memory that includes the lower page of the MLC. The lower page reference voltage is described in the discussion of FIG. 3 below, but may be a voltage that may be applied to a control gate of the MLC to differentiate between two states of the MLC if at least one of the pages of the MLC are not programmed. In at least one embodiment, the lower page reference voltage may be used to differentiate between states of the MLC if the lower page is programmed but no upper pages are programmed, so a single bit is stored in the MLC, even though the MLC is enabled to store multiple bits of data.

If the upper page of the MLC has been programmed, the MLC may be accessed once at block 105 using a middle upper page reference voltage. Upper page reference voltages are described in the discussion of FIG. 3 below, but may be voltages that may be applied to a control gate of the MLC to differentiate between states of the MLC if at least two of the pages of the MLC are programmed. In at least one embodiment, the MLC may be capable to store no more than two bits of data, and three upper page reference voltages may be defined. A middle upper page reference voltage may refer to an upper page reference voltage that can differentiate between states of the MLC that store a '0' in the lower page of the MLC and the states that store a '1' in the MLC. After the single access of the MLC in either block 104 or block 105, a state of the lower page of the MLC may be sensed at block 106, based, at least in part, on conductivity of the MLC during the single access. The read may finish at block 119.

If a lower page of the MLC is not being read, as determined at block 102, the MLC may be accessed one or more times using upper page reference voltages at block 110 in response to the read request addressed to the page of memory that includes the upper page of the MLC. The number of accesses and the selection of upper page reference voltage used for an individual access may vary according to the embodiment. The state of the upper page of the MLC may be sensed at block 111, based, at least in part, on conductivity of the MLC during the one or more accesses.

FIG. 2A is a block diagram of a solid state drive (SSD) 200 suitable for use in an embodiment. The SSD 200 may have an external interface 201, which may be any type of physical or logical interface, and may be used to connect to a computer or other device such as a cell phone or digital camera using a standard or proprietary communication protocol. The SSD 200 may emulate a drive based on a spinning magnetic disk, or may implement other protocols. Examples of protocols that the external interface 201 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

The SSD 200 may include a solid state drive controller 210 coupled to one or more MLC flash memory devices, such as MLC NAND flash memory 220A and MLC NAND flash memory 220B. The SSD controller 210 may include controlling circuitry 212 and circuitry 211 to interface to the external interface 201 of the SSD 200. The controller 212 may be a processor, microprocessor, microcontroller, finite state machine, or some other type of circuitry, which may, in some embodiments, execute instructions of a program, which may be stored on a non-transitory storage medium, such as volatile or non-volatile electronic memory 213. In some embodiments a program may be stored on one of the electronic memory devices coupled to the SSD controller 210, such as MLC NAND flash memory 220A. In other embodiments, any combination of one or more computer readable storage medium(s) may be utilized to store a program. A computer readable storage medium may be embodied as, for example, an electronic, magnetic, optical, electromagnetic, infrared, or semiconductor system, apparatus, or device, or other like storage devices known to those of ordinary skill in the art, or any suitable combination of computer readable storage mediums described herein. In the context of this document, a computer readable storage medium may be any tangible medium that can contain or store a program and/or data for use by or in connection with an instruction execution system, apparatus, or device.

A program running on the controlling circuitry 212 may implement many different functions including, but not limited to, an operating system, a file system, memory block remapping, and error management, as well as various methods described herein. Other embodiments may provide for the methods described herein by providing other hardware or processors. Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The SSD controller 210 may also include memory 214, which may be called various names including status memory, write buffers, read buffers, scratchpad memory, or other names, to temporarily store data such as program status information, uncorrected data pages, corrected data pages, or other intermediate results that may be generated by the controlling circuitry 212. In some embodiments, the SSD controller 210 may be integrated onto a single integrated circuit, although some embodiments may use multiple integrated circuits and/or other circuitry for the SSD controller 210. In some embodiments, SSD controller 210 may be integrated with an MLC NAND flash memory for non-volatile memory storage. The SSD controller 210 may have one or more controller interfaces coupled to the one or more MLC memory devices 220A/B by one or more memory bus 215A/B. In some embodiments a separate memory bus may be used for individual MLC flash memory devices, but other embodiments may couple multiple MLC flash memory devices to a single memory bus. In some embodiments, the memory bus 215A/B may be compliant, at least in part, with a version of the Open NAND Flash Interface (ONFI) Specification such as the ONFI Specification Revision 3.0, published on Mar. 9, 2011 by the ONFI Workgroup and available for download from www.onfi.org.

FIG. 2B is a block diagram of an electronic memory device 220 suitable for use in an embodiment. The electronic memory device 220 may have a memory interface 221 capable of coupling to the controller interface of the SSD controller 210. Circuitry 280 may couple to the memory interface 221 and to any number of pages of memory of any size, such as pages 231-234. The electronic memory device 220 may include any number of multi-level cells (MLCs), including MLCs 242, 244, 252, 254, 262, 264, 272, 274.

The MLCs may be organized in any logical memory organization, but in some embodiments, the MLCs are organized into NAND strings as shown in FIG. 2C. FIG. 2C is a schematic of a floating gate NAND flash string 270 suitable for use in an embodiment. Although two MLC are included in the string 270 shown, any number of MLCs may be included in a NAND string in other embodiments. The NAND string 270 shown includes MLC 272 and MLC 274 from FIG. 2B coupled together to form a string. One end of the string may be coupled to a source line 278 through a select gate source field-effect transistor (FET) 271 and the other end of the string may be coupled to a bit line 279 by a select gate drain FET 276. A first word line 273 may be coupled to the control gate of the MLC 272 and a second word line 275 may be coupled to the control gate of the MLC 274. A voltage applied to the control gate of an MLC 272, 274 through a word line 273, 275 may allow the MLC 272, 274 to be conductive if the voltage at the control gate 273, 275 is higher than the threshold voltage ($V_t$) of the MLC 272, 274. If the voltage applied to the control gate is less than $V_t$, the MLC 272, 274 may be non-conductive.

The MLCs may store any number of bits of data per MLC, and in at least some embodiments, the bits of data stored in a single MLC may be assigned to separate pages of the memory device 220. Referring back to FIG. 2B, the various MLCs 242, 244, 252, 254, 262, 264, 272, 274 may, in the embodiment shown, individually store up to 2 bits of information that are assigned to different pages of memory. So in the embodiment shown, the first page of memory 231 includes the lower pages of the first MLC 242, the second MLC 252, the third MLC 262, and the fourth MLC 272, while the second page of memory 232 includes the upper pages of the first MLC 242, the second MLC 252, the third MLC 262, and the fourth MLC 272. The third page of memory 233 and fourth page of memory 234 respectively include the lower and upper pages of the fifth MLC 244, the sixth MLC 254, the seventh MLC 264 and the eighth MLC 274. If an MLC is able to store more than two bits of information, it may be split into more than two pages of memory in some embodiments.

FIG. 3 shows various states of a multi-level cell (MLC) suitable for use in an embodiment. The graphs 310, 330 show example statistical distributions of threshold voltages of MLCs across multiple electronic memory devices in different states. The horizontal axes represent voltage and the vertical axes represent a relative number of individual MLCs that exhibit a threshold voltage at a particular voltage level. Graph 310 shows two different states of the MLC where only the lowest page of the MLC is programmed. The erased or $X1_2$, distribution curve 321 may cover a first range of voltages from $V_{EL}$ 311 to $V_{EH}$ 312 and may represent the erased state, which may be used to indicate that the lowest page of the MLC is storing a '1'. The $X0_2$ distribution curve 320 may cover a second voltage range from $V_{OL}$ 313 to $V_{OH}$ 314 and may be used to indicate that the lowest page of the MLC is storing a '0' without any upper pages being programmed. When a voltage equal to a lower page reference voltage ($V_{LP}$) 322 is applied to a control gate of an MLC, if the threshold voltage of the MLC is in the erased range 321, the MLC is conductive, but if the threshold voltage of the MLC is in the second range 320, the MLC is non-conductive. Thus, applying a voltage of $V_{LP}$ 322 to a control gate of an MLC may be useful for differentiating between states of an MLC and may be useful to determine a value stored in the lower page of the MLC if no upper pages are programmed. While the specific voltage ranges may vary according to the embodiment, in one embodiment, $V_{EL}$ 311 may be about −2.5V, $V_{EH}$ 312 may be about −0.5V, $V_{OL}$ 313 may be about 0.8V, and $V_{OH}$ 314 may be about 1.8V, with $V_{LP}$ 322 at about 0.6V.

A first page of an MLC may be considered lower than a second page if the first page can be programmed without programming the second page. So graph 310 shows a lower page programmed while the graph 330 shows both the lower page and an upper page programmed. Note that if an MLC can store 3 bits of information, the MLC may have a lowest page, a middle page and a highest page. In that situation, the lowest page and the middle page are lower pages to the highest page, and the middle page and the highest page are upper pages to the lowest page.

Graph 330 shows four different states of the MLC where both a lower page and an upper page are programmed. The erased, or $11_2$, distribution curve 343 may cover a first range of voltages from $V_{EL}$ 331 to $V_{EH}$ 332 and may represent the erased state, which may be used to indicate that both the lower page and the upper page of the MLC are storing a '1'. In some embodiments, the erased state may be the same no matter how many pages of the MLC are programmed. The $01_2$ distribution curve 341 may cover a second voltage range from $V_{01L}$ 333 to $V_{01H}$ 334 and may be used to indicate that the lower page of the MLC is storing a '1' and the upper page of the MLC is storing a '0'. The $00_2$ distribution curve 340 may cover a third voltage range from $V_{00L}$ 335 to $V_{00H}$ 336 and may be used to indicate that the lower page of the MLC is storing a '0' and the upper page of the MLC is storing a '0', and the $10_2$ distribution curve 342 may cover a fourth voltage range from $V_{10L}$ 337 to $V_{10H}$ 338 and may be used to indicate that the lower page of the MLC is storing a '0' and the upper page of the MLC is storing a '1'. Three different upper page reference voltages are also shown. The $1^{st}$ upper page reference voltage ($V_{UP1}$) 344 may be a voltage between the erased distribution 343 and the $01_2$ distribution 341. The $2^{nd}$ upper page reference voltage ($V_{UP2}$), or middle upper page reference voltage 345 may be a voltage between the $01_2$ distribution 341 and the $00_2$ distribution 340, and the $3^{rd}$ upper voltage range ($V_{UP3}$) 346 may be between the $00_2$ distribution 340 and the $10_2$ distribution 342. While the specific voltage ranges may vary according to the embodiment, in one embodiment, $V_{EL}$ 331 may be about −2.5V, $V_{EH}$ 332 may be about −0.5V, $V_{01L}$ 333 may be about 0.4V, and $V_{01H}$ 334 may be about 0.8V, $V_{00L}$ 335 may be about 1.4V, and $V_{00H}$ 336 may be about 2.0V, $V_{10L}$ 337 may be about 2.8V, and $V_{10H}$ 338 may be about 4.5V, with $V_{UP1}$ 344 about 0.0V, $V_{UP2}$ 345 about 1.1V, $V_{UP3}$ 346 about 2.4V.

In many flash technologies, programming a flash cell may increase $V_t$, but not decrease it. To decrease $V_t$, the flash cell may be erased, which may erase a large number of other cells as well. The graphs 310, 330 also show possible programming possibilities. If the MLC is erased and in the $X0_2$ distribution 321, the lower page of the MLC may be programmed to a '0', as shown by arrow 301, by increasing the $V_t$ of the MLC to be in the $X0_2$ distribution 320, or it may be left in the $X0_2$ distribution 321 to indicate that the value stored in the lower page is a '1'. To 'program' the upper page as a '1' with the lower page a '1', arrow 302 shows the MLC being left in the erased distribution 343, which may be thought of as setting $V_t$, even though $V_t$ may not be changed. Arrow 303 shows the upper page programmed to '0' with the lower page at '1', with the MLC going to the $01_2$ distribution 341. If the lower page has been programmed to a '0' so that the MLC is in the $X0_2$ distribution 320, arrow 304 shows programming the upper page to a '0' by transitioning to the $00_2$ distribution 340, and arrow 305 programming the upper page to a '1' by transitioning to the $10_2$ distribution 342. Note that the arrows 301-305 show $V_t$ increasing or staying the same. Some embodiments may allow additional programming transitions, such as changing from the $01_2$ distribution 341 to the $00_2$ distribution 340, as long as the transition increases $V_t$, but other embodiments may only allow one programming operation to a page before erasing the page.

In the example shown in FIG. 3, the MLC is able to store two bits of information. If an MLC is capable of storing more than 2 bits of information, then $2^n$ voltage ranges may be defined for $V_t$ to allow 'n' bits to be stored in 'n' pages. While some embodiments may not have the same restrictions, in at least one embodiment, the lowest page may be programmed first, then the successive higher pages programmed, until the highest page has been programmed. To program an upper page, the data stored in lower pages may be read first to allow the proper $V_t$ to be programmed based on the data previously stored in the lower pages and the data currently being programmed. Traditionally, the read of the lower pages has been done within the flash memory device, but because many flash devices do not include error correction logic, errors in the lower page may not have been corrected before the data was used to determine what value of $V_t$ to use to program an upper page, propagating errors.

Traditionally, the memory device itself has kept track of which pages had been programmed through the use of flag bits or other metadata that may have been stored in the flash device. But to get the metadata, the metadata may be read from other flash cells and may not have been available right away for use in responding to a read or program request. Because of this, traditionally, a read of the MLC may have first been done using the middle upper reference voltage 345. If it was found that the upper page had not been programmed yet, a second access using the lower page reference voltage may have been performed by the memory device, slowing the read even further.

Figure 4:
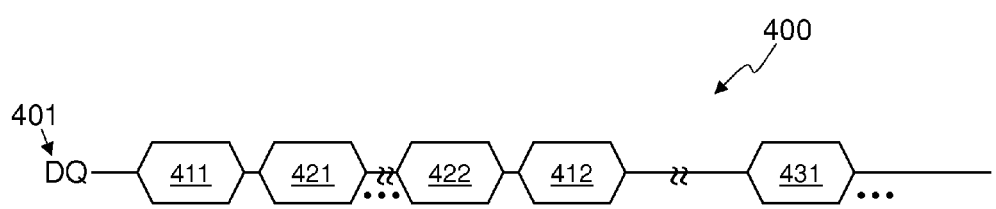
FIG. 4 shows a sample read command sequence of a bus protocol suitable for use in an embodiment.

FIG. 4 shows a sample read command sequence 400 of a bus protocol suitable for use in an embodiment. While other types of communication protocols may be used in some embodiments, a byte wide, multiplexed address/data (DQ) bus 401 is shown which may be similar to a bus defined in the ONFI specification. The communication may occur at any speed, but a symbol rate in the range of 10 megahertz (MHz) to 100 MHz may be typical. A first cycle of the access may be a command opcode for a read 411. The opcode value may vary depending on the type of read and the embodiment. An address 421, 422 may then be sent on the DQ lines 401 in one or more cycles. Any number of cycles may be used for the address depending on the storage capacity of the memory device and the page size. A second opcode or parameters 412 may be sent in some embodiments at the end of the read request. In at least one embodiment, a common starting opcode 411 for a read may be used for two different types of reads, with different parameters 412 sent to indicate the type of read. After some period of time, read data 431 may be returned in one or more cycles.

Figure 5:
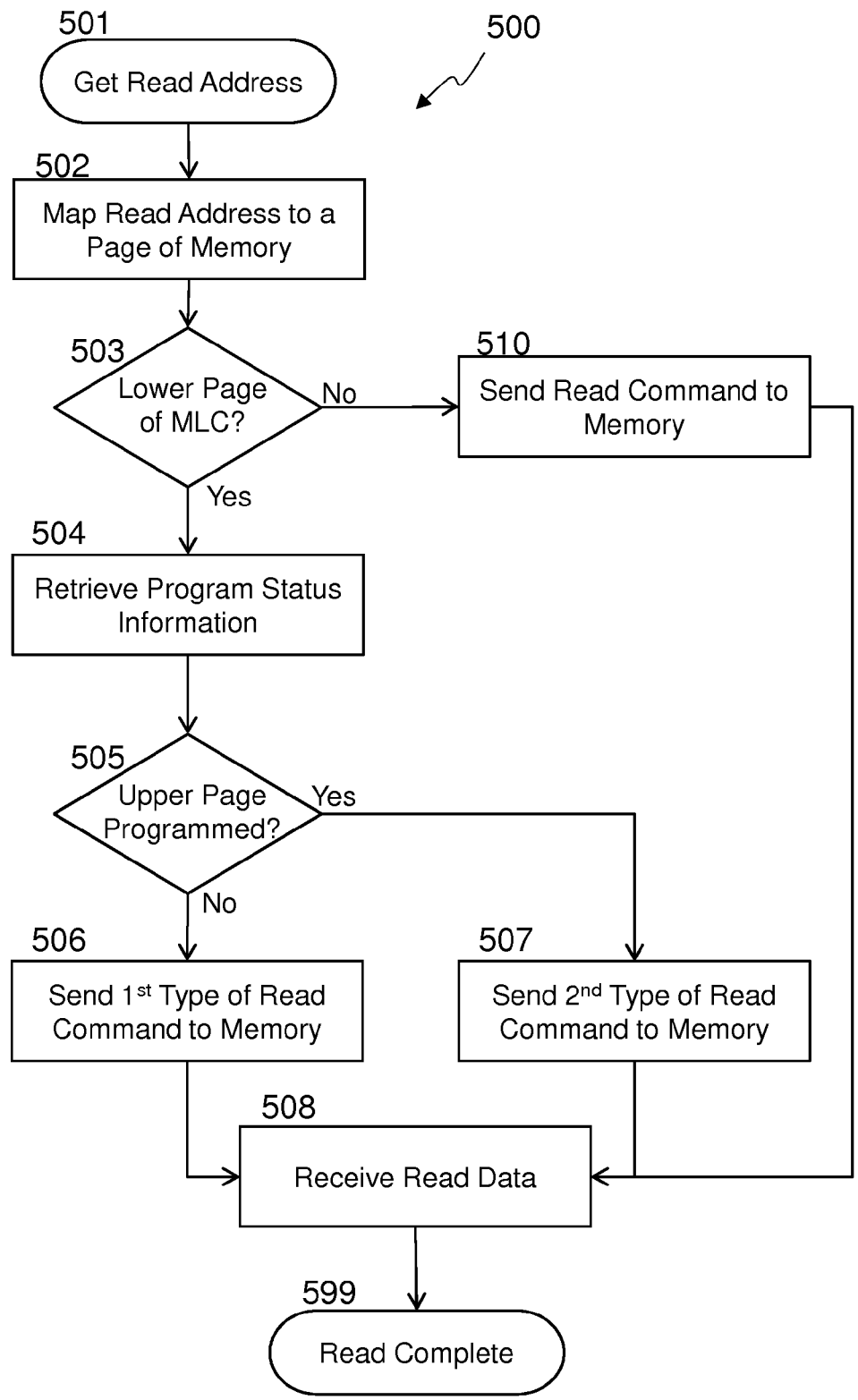
FIG. 5 is a flow chart of an embodiment of a method for a controller to read an electronic memory.

FIG. 5 is a flow chart 500 of an embodiment of a method for a controller to read an electronic memory. At block 501, the controller may get a read address and initiate a read operation. The read operation may be initiated by a disk read command sent to the controller of a solid-state drive or USB memory stick, accessing a picture stored on a flash memory card in a digital camera, starting a downloaded app in a hand-held device such as a smart phone, or any other type of operation. The read address may be mapped to a targeted page of memory that includes one page of an MLC at block 502. Mapping may map a logical address received to a physical address, and/or may include checking a table of bad pages of memory that have been reallocated to redundant or other pages of memory. At block 503 it may be determined if the targeted page of memory includes a lower page of the MLC. If the addressed page of memory does not include a lower page of the MLC, the controller may send a read command addressed to the targeted page through the controller interface at block 510 and the read data may be received at block 508 before the read is complete at block 599. The read command sent at block 510 may be a read command that is able to address any address of the electronic memory or a read command that is able to address upper pages only, and may be the same or different than one of the two types or read command discussed below, so the read command sent in block 510 may be a third type of read command in some embodiments.

If it is determined at block 503 that the targeted page of memory includes a lower page of the MLC, the controller may determine whether another page of memory that includes an upper page of the same MLC has been programmed. In some embodiments, the controller may determine whether the page of memory that includes an upper page of the MLC has been programmed by retrieving program status information at block 504. The program status information may be retrieved from status memory in the controller, the electronic memory that includes the MLC, or from some other storage location, depending on the embodiment. If it is determined that an upper page of the MLC has not been programmed at block 505, the controller may send a first type of read command, addressed to the page of memory that includes the lower page of the MLC, to the electronic memory at block 506. If it is determined that an upper page of the MLC has been programmed, the controller may send a second type of read command, addressed to the page of memory that includes the lower page of the MLC, to the electronic memory at block 507. In some embodiments, the first read command and the second read command may utilize different opcodes but in other embodiments, the first read command and the second read command may utilize the same read opcode but include parameters to indicate which type of read is to be performed. Sending either the first type of read or the second type of read may be interpreted as sending a read command through the controller interface that includes an indication of whether the page of memory that includes the lower page of the MLC has been programmed. Sending a read command may be interpreted as using a read command in embodiments. The controller may then receive the read data at block 508 and the read may be complete at block 599.

Figure 6:
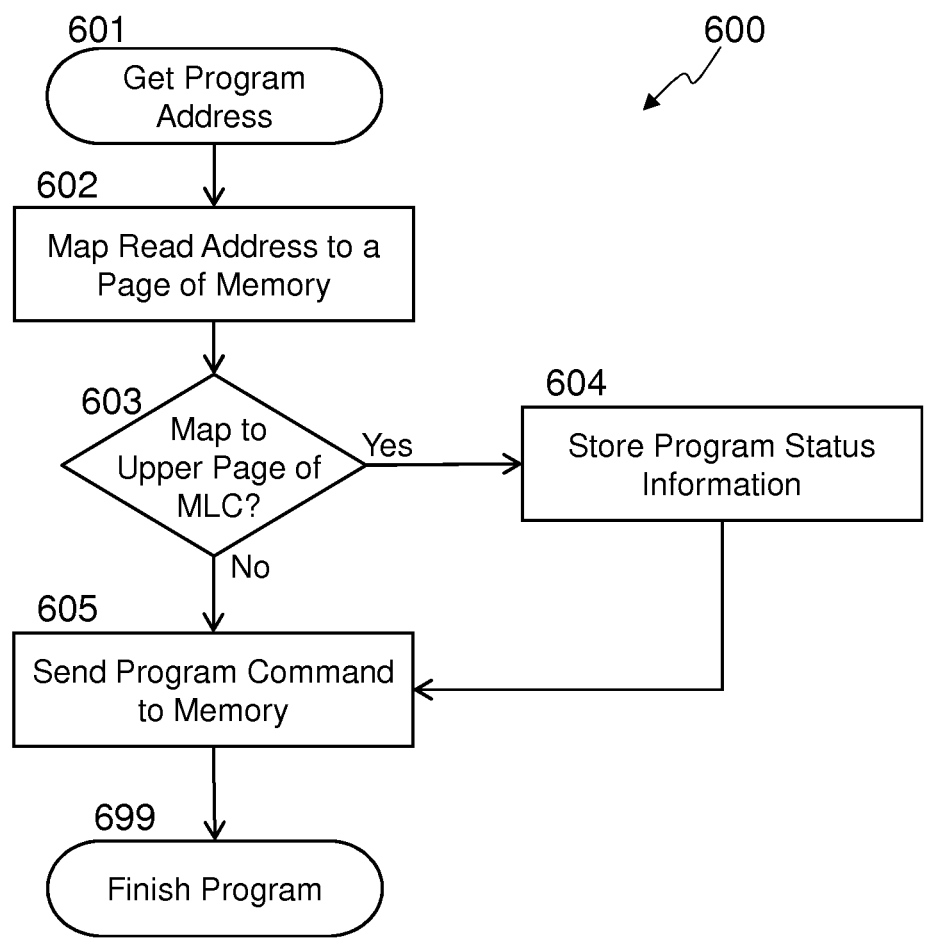
FIG. 6 is a flow chart of an embodiment of a method for a controller to program an electronic memory.

FIG. 6 is a flow chart 600 of an embodiment of a method for a controller to program an electronic memory. A programming operation may be initiated for any purpose and a program address received at block 601. At block 602, the program address may be mapped to a page of memory that includes a page of the MLC and a determination may be made as to whether the program address maps to a page of memory that includes an upper page of an MLC at block 603. If the page of memory includes an upper page of the MLC, program status information may be stored in status memory at block 604 to indicate that the page of memory including the upper page of the MLC has been programmed. The status memory may be located in the controller, the electronic memory that includes the MLC, or from some other storage location, depending on the embodiment. Whether or not it is determined that the program address maps to a page of memory that includes an upper page of the MLC at block 603, at block 605, the controller may send a program command addressed to the page of memory mapped from the program address through the controller interface before the program operation is finished at block 699. Note that order of the actions of block 604 and block 605 may vary in different embodiments and that the program status information may be retrieved during a read operation as described in FIG. 5. While in the embodiment of FIG. 6, the controller stored program status information as a part of the program operation, in other embodiments, an electronic memory device may store the program status information on its own if a program operation occurs.

Figure 7A:
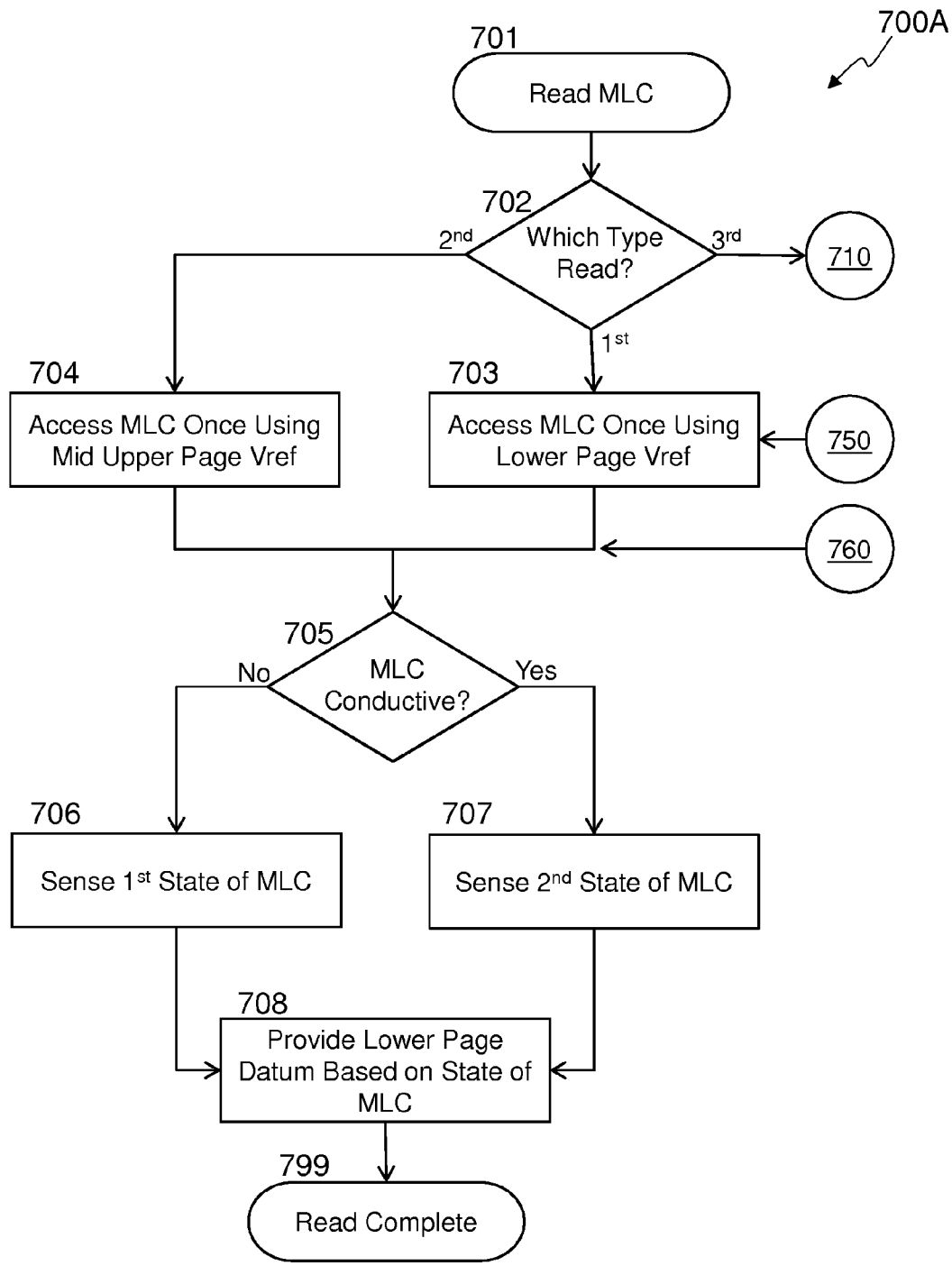
FIGS. 7A and 7B are a flow chart of an embodiment of a method by an electronic memory device to read an electronic memory.
Figure 7B:
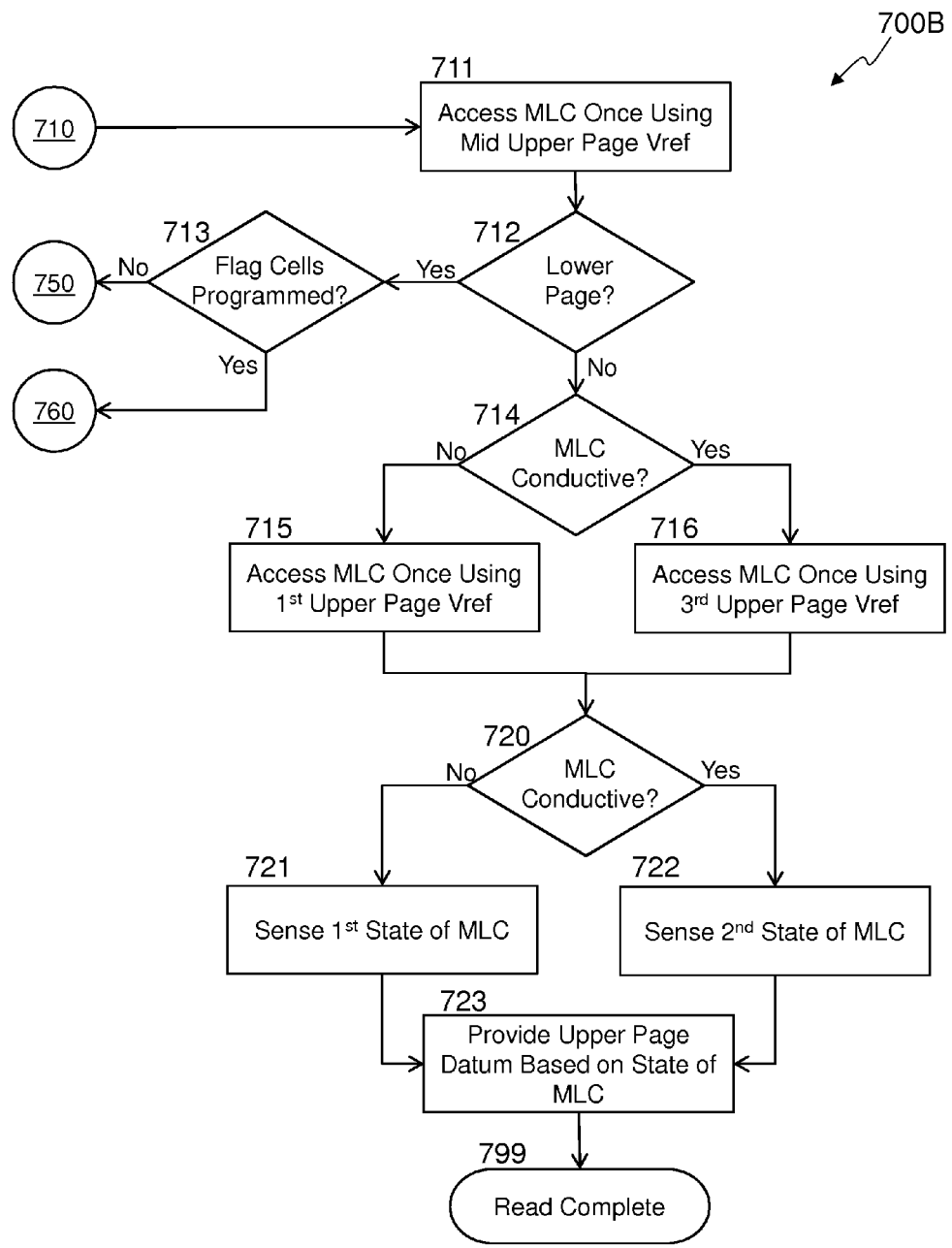

FIGS. 7A and 7B show two sections 700A, 700B of a flow chart of an embodiment of a method by an electronic memory device to read an electronic memory. The first section 700A is coupled to the second section 700B at a first point 710, a second point 750 and a third point 760. The electronic memory may detect a read command at block 701, received by an interface of the electronic memory, as the read request, addressed to a page of memory. In some embodiments, multiple types of read commands may be used. If the addressed page of memory includes an upper page of an MLC, the third type of read may be used. If the addressed page of memory includes a lower page of an MLC, one of three types of read commands may be used. Note that an addressed page of memory that includes a lower page of an MLC may have an associated page of memory that includes an upper page of the MLC. If a first type of read command, addressed to a page of memory that includes a lower page of an MLC is used, no upper page of the MLC has been programmed, so the first type of read command includes information to indicate that an associated page of memory of the electronic memory has not been programmed. If the second type of read command, addressed to a page of memory that includes a lower page of an MLC is used, at least one upper page of the MLC has been programmed, so the second type of read command includes information to indicate that an associated page of memory of the electronic memory has been programmed.

A type of read command may be checked at block 702. If the first type of read command was received, the MLC may be accessed one time using the lower page reference voltage in block 703. Note that even though the MLC may only be storing one bit of information if no upper page is programmed, the associated page of memory is enabled during the time that the first type of read command is used and may be programmed at a later time without changing modes in the memory device. If the second type of read command was received, the MLC may be accessed one time using the middle upper page reference voltage in block 704. So information included in the read command may be used to determine if the associated page of memory has been programmed, thereby allowing a different reference voltage to be used during the access.

At block 705 the conductivity of the MLC is checked during the access at block 703 or block 704. If the MLC is not conductive, the MLC may be sensed to be in a first state at block 706, and if the MLC is conductive, the MLC may be sensed to be in a second state at block 707, so the state of the lower page of the MLC may be sensed, based, at least in part, on conductivity of the MLC during the single access. After sensing the state of the MLC at block 706 or block 707, a datum may be provided at the interface of the electronic memory based, at least in part, on the state of the lower page of the MLC at block 708 before the read is complete at block 799.

If it is determined that a third type of read is used at block 702, the MLC may be accessed a first time using the middle upper page reference voltage at block 711. The addressed page may be checked at page 712 and if a lower page of an MLC is included in the addressed page, flag bits stored in the electronic memory device may be checked at block 713 to find out if an associated page that includes an upper page of the same MLC has been programmed. If the associated page has been programmed, conductivity of the MLC is checked at block 705 and continues through block 706/707 and 708. If the associated page has not been programmed, the MLC may be accessed again using the lower page reference voltage at block 703 and then continue through the flowchart 700A.

If the addressed page is found to include an upper page of the MLC at block 712, which may be equivalent to not including a lower page of the MLC in some embodiments, the conductivity of the MLC is checked at block 714. The MLC may be accessed a second time, using the first upper page reference voltage at block 715 if the MLC is conductive, and using the third upper page reference voltage at block 716 if the MLC is not conductive. The conductivity of the MLC is checked again during the second access at block 720. If the MLC is not conductive, the MLC may be sensed to be in a first state at block 721, and if the MLC is conductive, the MLC may be sensed to be in a second state at block 722, so the state of the upper page of the MLC may be sensed, based, at least in part, on conductivity of the MLC during the second access. After sensing the state of the MLC at block 721 or block 722, a datum may be provided at the interface of the electronic memory based, at least in part, on the state of the upper page of the MLC at block 723. In at least one embodiment, the datum returned for the upper page may be a '1' if MLC the has the same of conduction during the first and second access, and a '0' if the MLC has different states of conduction during the first and second access. The read may be complete at block 799.

Figure 8:
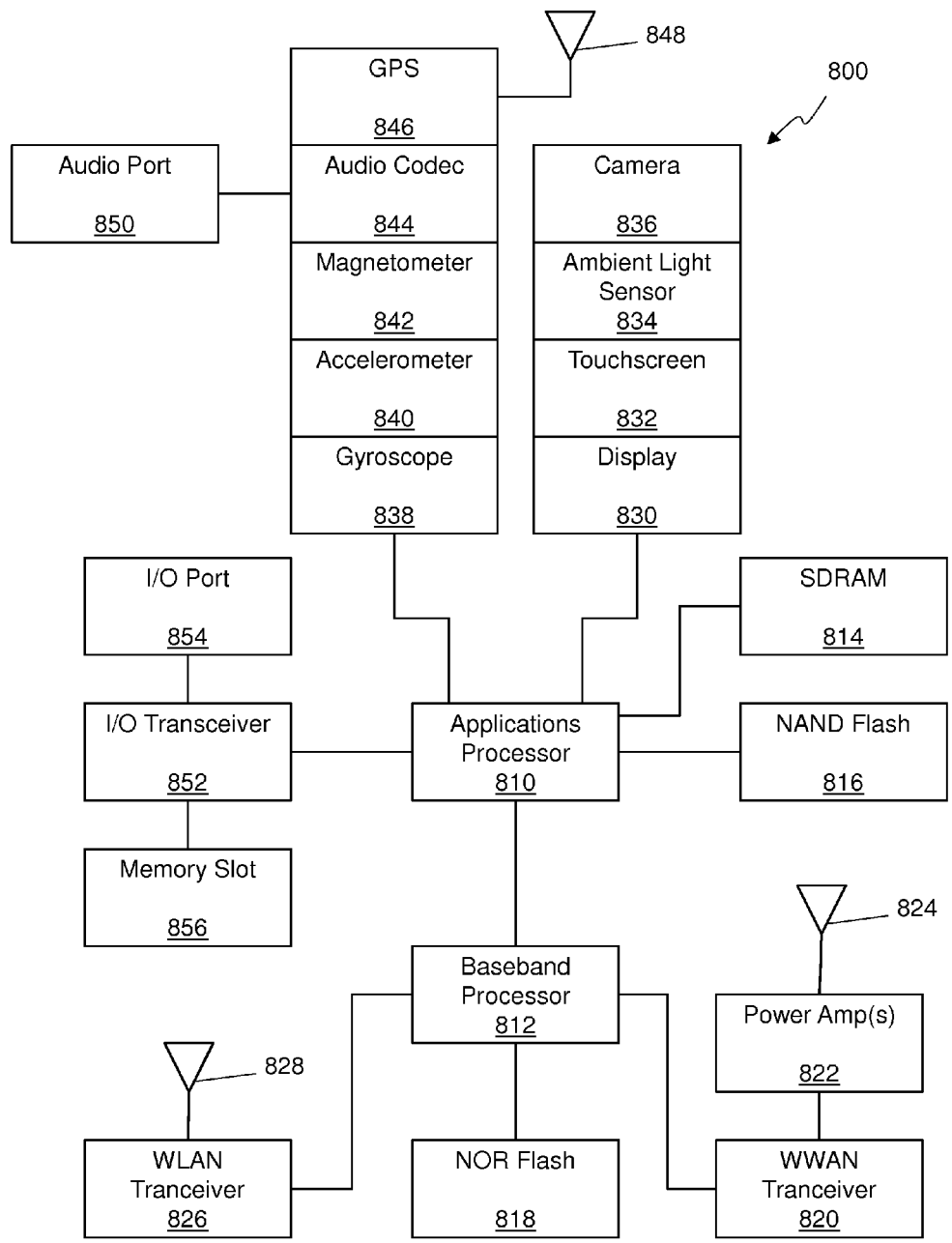
FIG. 8 is a block diagram of an information handling system using one or more embodiment.

Referring now to FIG. 8, a block diagram of an information handling system 800 may tangibly embody MLC memory 816, 818, embodiments or aspects of which may be shown in and described in FIG. 1 through FIG. 7. Various controller functions described in FIG. 1 through FIG. 7 may be performed by the applications processor 810, the baseband processor 812, or other controller blocks not shown. Information handling system 800 may represent a computer, a smartphone, a tablet, or any other type of information handling system. Although information handling system 800 represents one example of several types of computing platforms, information handling system 800 may include more or fewer elements and/or different arrangements of elements than shown in FIG. 8, and the scope of the claimed subject matter is not limited in these respects.

In one or more embodiments, information handling system 800 may include an applications processor 810 and a baseband processor 812. Applications processor 810 may be utilized as a general purpose processor to run applications and the various subsystems for information handling system 800. Applications processor 810 may include a single core or alternatively may include multiple processing cores wherein one or more of the cores may comprise a digital signal processor or digital signal processing core. Furthermore, applications processor 810 may include a graphics processor or coprocessor disposed on the same chip, or alternatively a graphics processor coupled to applications processor 810 may comprise a separate, discrete graphics chip. Applications processor 810 may include on board memory such as cache memory, and further may be coupled to external memory devices such as synchronous dynamic random access memory (SDRAM) 814 for storing and/or executing applications during operation, and NAND flash 816, which may include MLCs, for storing applications and/or data even when information handling system 800 is powered off. Baseband processor 812 may control the broadband radio functions for information handling system 800. Baseband processor 812 may store code for controlling such broadband radio functions in a NOR flash 818, which may include MLCs. Baseband processor 812 controls a wireless wide area network (WWAN) transceiver 820 which is used for modulating and/or demodulating broadband network signals, for example for communicating via a WiMAX network based on IEEE 802.16p or 3GPP LTE network or the like. The WWAN transceiver 820, which may be thought of as a network interface, couples to one or more power amps 822 respectively coupled to one or more antennas 824 for sending and receiving radio-frequency signals via the WWAN broadband network. The baseband processor 812 also may control a wireless local area network (WLAN) transceiver 826, which may be thought of as a network interface, coupled to one or more suitable antennas 828 and which may be capable of communicating via a Wi-Fi, Bluetooth, and/or an amplitude modulation (AM) or frequency modulation (FM) radio standard including an IEEE 802.11 a/b/g/n standard or the like. Other embodiments may include one or more network interfaces to wired networks in place of, or in addition to, the wireless network interfaces. It should be noted that these are merely example implementations for applications processor 810 and baseband processor 812, and the scope of the claimed subject matter is not limited in these respects. For example, any one or more of SDRAM 814, NAND flash 816 and/or NOR flash 818 may comprise other types of memory technology such as magnetic memory, chalcogenide memory, phase change memory, or ovonic memory, and the scope of the claimed subject matter is not limited in this respect.

In one or more embodiments, applications processor 810 may drive a display 830 according to embodiments described herein for displaying various information or data, and may further receive touch input from a user via a touch screen 832 for example via a finger or a stylus. An ambient light sensor 834 may be utilized to detect an amount of ambient light in which information handling system 800 is operating, for example to control a brightness or contrast value for display 830 as a function of the intensity of ambient light detected by ambient light sensor 834. One or more cameras 836 may be utilized to capture images that are processed by applications processor 810 and/or at least temporarily stored in NAND flash 816. Furthermore, applications processor may couple to a gyroscope 838, accelerometer 840, magnetometer 842, audio coder/decoder (CODEC) 844, and/or global positioning system (GPS) controller 846 coupled to an appropriate GPS antenna 848, for detection of various environmental properties including location, movement, and/or orientation of information handling system 800. Alternatively, controller 846 may comprise a Global Navigation Satellite System (GNSS) controller. Audio CODEC 844 may be coupled to one or more audio ports 850 to provide microphone input and speaker outputs either via internal devices and/or via external devices coupled to information handling system via the audio ports 850, for example via a headphone and microphone jack. In addition, applications processor 810 may couple to one or more input/output (I/O) transceivers 852 to couple to one or more I/O ports 854 such as a universal serial bus (USB) port, a high-definition multimedia interface (HDMI) port, a serial port, and so on. Furthermore, one or more of the I/O transceivers 852 may couple to one or more memory slots 856 for optional removable memory such as secure digital (SD) card or a subscriber identity module (SIM) card, although the scope of the claimed subject matter is not limited in these respects.

As will be appreciated by those of ordinary skill in the art, aspects of the various embodiments described above may be embodied as a system, method or computer program product. Accordingly, aspects of various embodiments may take the form of an entirely hardware embodiment, an entirely software embodiment (including firmware, resident software, micro-code, or the like) or an embodiment combining software and hardware aspects. Furthermore, aspects of the various embodiments may take the form of a computer program product embodied in one or more computer readable medium(s) having computer readable program code stored thereon.

The flowchart and/or block diagrams in the figures help to illustrate the architecture, functionality, and operation of possible implementations of systems, and methods of various embodiments. Various blocks in the flowcharts and block diagrams may represent hardware, software, or a combination, even within a single figure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example apparatus may include a multi-level cell (MLC), a first page of memory comprising a lower page of the MLC, a second page of memory comprising an upper page of the MLC, and circuitry coupled to the MLC. In the example apparatus, the circuitry may be capable to determine whether the second page of memory has been programmed, access the MLC once, using a lower page reference voltage if the second page has not been programmed or using an upper page reference voltage if the second page has been programmed, in response to a read request addressed to the first page of memory with the MLC enabled to store multiple bits of data, and sense a state of the lower page of the MLC, based, at least in part, on conductivity of the MLC during the single access. In some example apparatuses the MLC is capable to store no more than two bits of data. Some example apparatuses may also include a memory interface to receive commands and exchange data compliant with a memory access protocol. In some example apparatuses the circuitry is also capable to detect a read command, addressed to the first page of memory, received by the interface, as the read request, use information, included with the read command, to determine whether the second page of memory has been programmed, provide a datum through the memory interface, based, at least in part, on the state of the lower page of the MLC. In some example apparatuses the memory access protocol is compliant, at least in part, with an Open NAND Flash Interface (ONFI) protocol. Some example apparatuses may also include an electronic memory device including the first page of memory, the second page of memory, the memory interface, and at least some of the circuitry, and a controller including a controller interface, coupled to the memory interface, to send commands and exchange data compliant with the memory access protocol. In some example apparatuses the controller is capable to map a read address to the first page of memory, retrieve program status to generate said information to indicate whether the second page has been programmed, send the read command with said information, addressed to the first page of memory, to the electronic memory device, through the controller interface. In some example apparatuses the controller may include a solid state drive controller, and the controller may include I/O circuitry coupled to an external interface. In some example apparatuses the MLC may include an element of a solid state drive. In some example apparatuses the circuitry is further capable to access the MLC one or more times using upper page reference voltages, in response to a read request addressed to the second page of memory, and sense a state of the upper page of the MLC, based, at least in part, on conductivity of the MLC during the one or more accesses. In some example apparatuses the circuitry, in response to a read request of the second page of memory, is further capable to access the MLC a first time using a middle upper page reference voltage, access the MLC a second time, using a first upper page reference voltage if the MLC was conductive during the first access, or using a third upper page reference voltage if the MLC was not conductive during the first access, and sense a state of the upper page of the MLC, based, at least in part, on conductivity of the MLC during the second access, where the MLC is capable to store no more than two bits of data. Some example apparatuses may also include status memory, and the circuitry may be further capable to store program status in the status memory to indicate whether the second page has been programmed, and retrieve the program status from the status memory to determine whether the second page has been programmed. In some example apparatuses the circuitry further may include a network interface. Any combination of the examples of this paragraph may be used in embodiments.

An example method to control an electronic memory may include using a first type of read command, addressed to a first page of memory of an electronic memory, that includes information to indicate that a second page of memory of the electronic memory has not been programmed, and using a second type of read command, addressed to the first page of memory, where the first page of memory may include a lower page of a multi-level cell (MLC), the second page of memory may include an upper page of the MLC, and the second page of memory is enabled during a period of time that the first type of read command is used. In some example methods the MLC is capable to store no more than two bits of data. In some example methods the first type of read command includes a read command and a first parameter, and the second type of read command includes the read command and a second parameter to indicate that the second page of memory has been programmed. Some example methods may also include using a memory communication protocol compliant, at least in part, with an Open NAND Flash Interface (ONFI) protocol, for communication between a controller and the electronic memory, where the memory communications protocol includes a first two command cycle sequence to represent the first type of read command, and a second two command cycle sequence to represent the second type of read command. Some example methods may also include storing metadata to indicate whether the second page of memory has been programmed, mapping a read address to the first page of memory, retrieving the metadata to determine whether the second page of memory has been programmed, using the first type of read command to read the first page of memory if the second page of memory has not been programmed, and using the second type of read command to read the first page of memory if the second page of memory has been programmed. Some example methods may also include mapping another read address to the second page, and using the second type of read command to read the second page of memory. Some example methods may also include mapping another read address to the second page, and using a third type of read command to read the second page of memory, where the second type of read command includes information to indicate that the second page of memory has been programmed. Some example methods may also include accessing the MLC once, in response to receiving a read command, addressed to the first page of memory at the electronic memory, using a lower page reference voltage if the first type of read command is received, or using a middle upper page reference voltage if the second type of read command is received, sensing a state of the lower page of the MLC, based, at least in part, on conductivity of the MLC during the single access, and providing a datum at an interface of the electronic memory based, at least in part, on the state of the lower page of the MLC. Some example methods may also include accessing the MLC one or more times using upper page reference voltages in response to receiving a read command addressed to the second page of memory at the electronic memory, determining a state of the MLC, based, at least in part, on conductivity of the MLC during said accessing. Some example methods may also include accessing the MLC a first time using the middle upper page reference voltage, in response to receiving a read command addressed to the second page of memory at the electronic memory, accessing the MLC a second time, using a $1^{st}$ upper page reference voltage if the MLC was conductive during the first access, or using a $3^{rd}$ upper page reference voltage if the MLC was not conductive during the first access, and sensing a state of the upper page of the MLC, based, at least in part, on conductivity of the MLC during the second access, where the MLC is capable to store no more than two bits of data. Any combination of the examples of this paragraph may be used in embodiments.

An example article of manufacture includes a non-transitory storage medium having instructions stored thereon that, if executed, result in mapping a read address to a first page of memory including a lower page of a multi-level memory cell (MLC), determining whether a second page of memory including an upper page of the MLC has been programmed, sending a first type of read command addressed to the first page of memory if the second page has not been programmed, and sending a second type of read command addressed to the first page of memory if the second page has been programmed. The instructions of some example articles of manufacturing may further result in retrieving program status to determine whether the second page has been programmed. The instructions of some example articles of manufacturing may further result in mapping a program address to the second page, sending a program command addressed to the second page, storing program status to indicate that the second page has been programmed, and retrieving the program status to determine whether the second page has been programmed. The instructions of some example articles of manufacturing may further result in communicating with a memory access protocol compliant, at least in part, with an Open NAND Flash Interface (ONFI) protocol. Any combination of the examples of this paragraph may be used in embodiments.

Example circuitry may include a controller, and a controller interface. In the example circuitry, the controller is capable to map a read address to a first page of memory including a lower page of a multi-level memory cell (MLC), determine whether a second page of memory including an upper page of the MLC has been programmed, and send a read command addressed to the first page of memory, through the controller interface, that includes an indication of whether the second page of memory has been programmed. In some example circuitry, the controller is capable to retrieve program status to determine whether the second page has been programmed. In some example circuitry, the controller is capable to map a program address to the second page, send a program command addressed to the second page through the controller interface, store program status information in status memory to indicate that the second page has been programmed, and retrieve said program status information to determine whether the second page has been programmed. Some example circuitry may include including an integrated circuit that includes the controller, the controller interface, and the status memory. In some example circuitry, the controller is capable to communicate over the controller interface with a memory access protocol compliant, at least in part, with an Open NAND Flash Interface (ONFI) protocol. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An apparatus comprising:
    a memory cell enabled to store multiple bits of data in the memory cell;
    a first page of memory comprising a lower page of the memory cell;
    a second page of memory comprising an upper page of the memory cell; and
    circuitry, coupled to the memory cell, to cause one or more accesses to the memory cell responsive to a read request addressed to the first memory page or the second memory page, the circuitry capable to:
        determine whether the second page of memory has been programmed;
        cause a single access of the memory cell via use of a lower page reference voltage if the second page has not been programmed or cause use of an upper page reference voltage if the second page has been programmed; and
        sense a state of the lower page of the memory cell, based, at least in part, on conductivity of the memory cell during the single access,
    wherein the circuitry, in response to a read request of the second page of memory, is further capable to:
        cause a first access of the memory cell via sue of a middle upper page reference voltage;
        cause a second access of the memory cell via use of a first upper page reference voltage if the memory cell was conductive during the first access or via use of a third upper page reference voltage if the memory cell was not conductive during the first access; and
        sense a state of the upper page of the memory cell, based, at least in part, on conductivity of the memory cell during the second access.

2. The apparatus of claim 1, comprising:
    a third page of memory comprising a middle page of the memory cell, wherein the memory cell is capable to store three or more bits of data.

3. The apparatus of claim 1, further comprising:
    a memory interface to receive commands and exchange data compliant with a memory access protocol;
    wherein the circuitry is further capable to:
    detect a read command, addressed to the first page of memory, received by the interface, as the read request;
    use information, included with the read command, to determine whether the second page of memory has been programmed; and
    provide a datum through the memory interface, based, at least in part, on the state of the lower page of the memory cell.

4. The apparatus of claim 3, wherein the memory access protocol is compliant, at least in part, with an Open NAND Flash Interface (ONFI) protocol.

5. The apparatus of claim 3, further comprising:
an electronic memory device comprising the first page of memory, the second page of memory, the memory interface, and at least some of the circuitry; and
a controller comprising a controller interface, coupled to the memory interface, to send commands and exchange data compliant with the memory access protocol;
wherein the controller is capable to:
   map a read address to the first page of memory;
   retrieve program status to generate said information to indicate whether the second page has been programmed; and
   send the read command with said information, addressed to the first page of memory, to the electronic memory device, through the controller interface.

6. The apparatus of claim 5, wherein the controller comprises a solid state drive controller, and wherein the controller further comprises I/O circuitry coupled to an external interface.

7. The apparatus of claim 1, wherein the memory cell comprises an element of a solid state drive.

8. The apparatus of claim 1, wherein the memory cell is capable to store no more than two bits of data.

9. The apparatus of claim 1, further comprising status memory; wherein the circuitry is further capable to:
   store program status in the status memory to indicate whether the second page has been programmed; and
   retrieve the program status from the status memory to determine whether the second page has been programmed.

10. The apparatus of claim 1, wherein the circuitry further comprises a network interface.

11. A method to control an electronic memory, the method comprising:
   using a first type of read command, addressed to a first page of memory of an electronic memory, that includes information to indicate that a second page of memory of the electronic memory has not been programmed;
   using a second type of read command, addressed to the first page of memory, wherein:
      the first page of memory comprises a lower page of a memory cell, the memory cell enabled to store multiple bits of data in the memory cell;
      the second page of memory comprises an upper page of the memory cell; and
      the second page of memory is enabled during a period of time that the first type of read command is used;
   causing a single access of the memory cell in response to receiving a read command addressed to the first page of memory at the electronic memory using a lower page reference voltage if the first type of read command is received or using a middle upper page reference voltage if the second type of read command is received;
   sensing a state of the lower page of the memory cell, based, at least in part, on conductivity of the memory cell during the single access; and
   providing a datum at an interface of the electronic memory based, at least in part, on the state of the lower page of the memory cell.

12. The method of claim 11, wherein the memory cell is capable to store three or more bits of data.

13. The method of claim 11, wherein the first type of read command includes a read command and a first parameter, and the second type of read command includes the read command and a second parameter to indicate that the second page of memory has been programmed.

14. The method of claim 11, further comprising:
   using a memory communication protocol compliant, at least in part, with an Open NAND Flash Interface (ONFI) protocol, for communication between a controller and the electronic memory;
   wherein the memory communications protocol includes a first two command cycle sequence to represent the first type of read command, and a second two command cycle sequence to represent the second type of read command.

15. The method of claim 11, further comprising:
   storing metadata to indicate whether the second page of memory has been programmed;
   mapping a read address to the first page of memory;
   retrieving the metadata to determine whether the second page of memory has been programmed;
   using the first type of read command to read the first page of memory if the second page of memory has not been programmed; and
   using the second type of read command to read the first page of memory if the second page of memory has been programmed.

16. The method of claim 11, further comprising:
   mapping another read address to the second page; and
   using the second type of read command to read the second page of memory.

17. The method of claim 11, further comprising:
   mapping another read address to the second page; and
   using a third type of read command to read the second page of memory;
   wherein the second type of read command includes information to indicate that the second page of memory has been programmed.

18. The method of claim 11, further comprising:
   accessing the memory cell one or more times using upper page reference voltages in response to receiving a read command addressed to the second page of memory at the electronic memory; and
   determining a state of the memory cell, based, at least in part, on conductivity of the memory cell during said accessing.

* * * * *